United States Patent [19]
Frei et al.

[11] Patent Number: 5,767,561
[45] Date of Patent: Jun. 16, 1998

[54] INTEGRATED CIRCUIT DEVICE WITH ISOLATED CIRCUIT ELEMENTS

[75] Inventors: Michel Ranjit Frei, Berkeley Heights, N.J.; Clifford Alan King, Ney York, N.Y.; Kwok K. Ng, Warren, N.J.; Harry Thomas Weston, New Providence, N.J.; Ya-Hong Xie, Flemington, N.J.

[73] Assignee: Lucent Technologies Inc., Murray Hill, N.J.

[21] Appl. No.: 853,582

[22] Filed: May 9, 1997

[51] Int. Cl.⁶ .................................................. H01L 29/00
[52] U.S. Cl. ........................... 257/499; 357/516; 357/296
[58] Field of Search ................................. 257/500, 507, 257/516, 296, 499, 506, 532; 438/359, 360, 409

[56] References Cited

U.S. PATENT DOCUMENTS

| | | | |
|---|---|---|---|
| 4,627,883 | 12/1986 | Hoemstrom et al. | 438/409 |
| 5,372,962 | 12/1994 | Hirota et al. | 437/47 |
| 5,475,255 | 12/1995 | Joardan et al. | 257/547 |
| 5,485,029 | 1/1996 | Crabbé et al. | 257/501 |
| 5,508,542 | 4/1996 | Geiss et al. | 257/301 |
| 5,512,777 | 4/1996 | Endo | 257/501 |
| 5,548,150 | 8/1996 | Omura et al. | 257/349 |
| 5,623,159 | 4/1997 | Monk et al. | 257/509 |

OTHER PUBLICATIONS

"Stress in Oxidized Porous Silicon Layers", by Barla, K. et al., *J. Appl. Phys.*, (2) pp. 439–441, (Jan. 15, 1986).

"Determination of Lattice Parameter and Elastic Properties of Porous Silicon by X-Ray Diffraction", by Barla, K. et al., *Journal of Crystal Growth*, 68, pp. 727–732 (1984).

"A Post Processing Method for Reducing Substrate Coupling in Mixed–Signal Integrated Circuits", by Basedau, P. et al., 1995 *Symposium on VLSI Circuits Digetst of Technical Papers*, pp. 41–42.

"Full Isolation Technology by Porous Oxidized Silicon and its Application to LSIs", by Imai, K. et al., *IEEE*, IEDM 81 pp. 376–379, (1981).

"Effect of Substrate Material on Crosstalk in Mixed Analogy/Digital Integrated Circuits", by Merrill, R.B. et al., *IEEE*, IEDM 94, pp. 433–436.

"A New Silicon–on–Insulator Structure Using a Silicone Molecular Beam Epitaxial Growth on Porous Silicon", by Konaka, S. et al., Musashino Electrical Communication Laboratory, Nippon Telephone and Telegraph Public Corporation, Tokyo 180, pp. 86–88.

"The Islands Method —A Manufacturabe Porous Silicone SOI Technology" by Zorinksy, E.J. et al., *IEEE*, IEDM 86, pp. 431–434 (1986).

"A New Dielectric Isolation Method Using Porous Silicon" by Imai, K., *Solid State Electronics*, vol. 24, pp. 159–164 (1981).

"Complete Dielectric Isolation by Highly Selective and Shelf-Stopping Formation of Oxidized Porous Silicon", by Holmstrom, R.P. et al., *Appl. Phys. Lett.*, 42 (4), pp. 386–388 (1983).

"Extended Study of Crosstalk in SOI–SIMOX Substrates", by Viviani, A. et al., *IEEE*, IEDM 95, pp. 713–716 (1995).

*Primary Examiner*—Tom Thomas
*Assistant Examiner*—Cuong Quang Nguyen
*Attorney, Agent, or Firm*—Richard J. Botos

[57] ABSTRACT

A device with at least one noise-sensitive element, at least one noise-generating element, and a porous silicon barrier in the substrate is disclosed. The porous silicon barrier isolates the noise-sensitive element from the signals coupled into the substrate by the noise-generating element. A process for making this device is also disclosed.

6 Claims, 1 Drawing Sheet

INTEGRATED CIRCUIT DEVICE WITH ISOLATED CIRCUIT ELEMENTS

BACKGROUND OF THE INVENTION

1. Technical Field

The present invention relates to an integrated circuit device with both digital and analog elements thereon and a method for making such a device.

2. Art Background

As the level of integration increases in integrated circuits (IC), it is increasingly common to incorporate different discrete devices into the IC. In certain instances, one type of device (referred to as a noise-generating device) will generate a signal that will adversely effect the operation of another type of device (referred to as a noise-sensitive device) in the same IC. One example of an IC with noise-generating elements and noise-sensitive elements thereon is a Mixed Signal IC, which has a combination of analog and digital functions on the same substrate.

As noted in Merrill, R. B., et al., "Effect of Substrate Material on Crosstalk in Mixed Analog/Digital Integrated Circuits," *IEDM* 94, pp. 433–435 (1994), cross-talk between the digital and analog functions is not desired. Basedau, P., et al. "A Post Processing Method for Reducing Substrate Coupling in Mixed-Signal Integrated Circuits," 1995 *Symposium on VLSI Circuits Digest of Technical Papers* pp. 41–42 (1995) note that, for mixed signal devices in which devices are formed on a thin p– epi (epi is shorthand for epitaxial) which, in turn, is formed over a heavily doped p+ substrate, the coupling of digital switching noise onto sensitive nodes of an analog circuit is particularly difficult to solve.

Numerous methods have been proposed to isolate the sensitive elements (e.g. analog elements) from the circuits that generate noise (e.g. digital elements) formed on the same substrate. Since these mixed-signal elements typically contain CMOS (Complementary Metal Oxide Semiconductor) devices, the methods are required to be compatible with conventional CMOS processing techniques. Merrill et al. suggests that the analog elements be isolated from the digital elements by forming an insulating layer of $SiO_2$ on the silicon wafer and forming a p-type silicon layer over the insulating layer (a technique called silicon-on-insulator)(SOI)), or by forming isolated junctions. Merrill et al. report that such isolation techniques provide an IC with acceptably low cross talk and adequate latch up immunity.

Basedau et al. suggest that particular analog elements be isolated from the digital elements by trenches etched from the backside of the wafer to the under surface of the field oxide. Although the desired isolation is provided by such a trench, the structural integrity of the wafer is compromised by this solution. Since the current methods for isolating digital elements from analog elements in an IC are not desirable from a manufacturability standpoint, alternative methods for achieving device isolation are desired.

SUMMARY OF THE INVENTION

The present invention is a process for fabricating an integrated circuit with at least one noise-sensitive element and one-noise generating element therein. Because both the noise-sensitive element and the noise-generating element are part of the same device, the elements are formed on the same single-crystalline silicon substrate. For purposes of the present invention, "noise" is an unwanted or undesirable signal that adversely affects the operation of a discrete device or circuit element.

In the process of the present invention, the noise-sensitive element is isolated from the noise generating element by a region of porous silicon formed in the substrate. The extent of the porous silicon region formed in the substrate will depend on the degree of isolation required. It is advantageous if the porous silicon region is such that there is no pathway in the remaining single-crystalline portion of the substrate (i.e., the non-porous portion) from the noise-generating element to the noise-sensitive element. However, it is contemplated that in some embodiments a single-crystalline pathway will remain between the two elements after the porous silicon region is formed. One skilled in the art will appreciate that, the smaller the cross-sectional area of this path, the smaller the amount of signal that will travel from the noise-generating element to the noise-sensitive element.

In one example of the present invention, the noise-sensitive element is an analog element and the noise-generating element is a digital element. Typically the substrate is a silicon substrate. In the process of the present invention, a lightly-doped layer is first formed on a more heavily doped substrate. The amount of dopant, the type of dopant and the process by which the substrate is doped are all conventional and well-known to one skilled in the art. In one embodiment of the present invention, the lightly-doped layer is a layer of epitaxial silicon lightly doped with a p– dopant formed over a heavily doped silicon substrate. The terms lightly doped and heavily doped are relative terms well-known to one skilled in the art. Lightly-doped means a dopant concentration that does not exceed about $10^{17}$ $cm^{-3}$. Heavily-doped means a dopant concentration of at least about $10^{18}$ $cm^{-3}$.

A patterned mask is then formed over the wafer to delineate the a regions of the substrate in which the porous silicon is to be formed. Only those regions of the wafer which are targeted as "isolation regions" are exposed through the mask. A top view of a substrate 10 with isolation regions 12 formed therein to effect isolation of circuit blocks 14 is illustrated in FIG. 1. Once the mask is formed, the substrate 10 is subjected to conditions which will form the isolation regions by converting the exposed silicon to porous silicon. Conventional conditions for forming porous silicon are contemplated as suitable. Typically porous silicon is formed by anodically etching silicon in a concentrated hydrofluoric acid solution.

As illustrated in FIG. 2, the porous silicon 12 is formed through the entire thickness of the substrate 20 (i.e. both the p– epi layer 22 and the heavily doped p+ layer 24) thereby isolating analog device 16 from digital device 18. However, as previously noted, the porous silicon region need not be formed through the entire thickness of the substrate. The extent of the porous silicon region formed in the substrate depends upon the degree of isolation required. For example in the context of mixed-signal devices, the amount of noise from the digital device that is received by the analog device is determined by the extent of the porous silicon region in the substrate. If the analog region of the substrate and the digital region of the substrate are completely isolated from each other by a region of porous silicon, then the amount of noise received by the analog element from the digital element is less than if there is a nonporous silicon path in the single-crystalline substrate from the digital region to the analog region. The larger the cross-sectional area of the non-porous silicon pathway in the substrate, the greater the amount of noise that will be received by the analog device from the digital device.

After the porous silicon region is formed, a layer of insulating material such as silicon dioxide ($SiO_2$) or silicon nitride ($Si_3N_4$) is optionally formed over the porous silicon region. Conventional techniques such as PECVD (plasma enhanced chemical vapor deposition) are utilized to form the insulating layer. It is advantageous if the thickness of the insulating layer is at least about 100 Å. Since the purpose of the insulating layer is to protect the porous silicon from exposure to conditions that would convert the porous silicon to oxide, the layer of insulating material is not required if the porous silicon will not be exposed to elevated temperatures in the presence of oxygen during subsequent processing.

After the porous silicon region is formed in the substrate, the patterned mask is no longer needed to define the porous silicon regions. Typically the patterned mask is formed from an energy sensitive resist material which is stripped from the substrate when the patterned mask has served its purpose. However, in certain embodiments the mask is formed from a material such as silicon nitride and can be used as an insulating layer in the device being fabricated. In these embodiments, removal of the patterned mask after the formation of the porous silicon region is not required.

In the process of the present invention, devices are formed on the remaining portions of the substrate either before or after the formation of the porous silicon regions therein. In the embodiment of the present invention wherein the device is a mixed signal device, the devices are positioned such that the analog devices are isolated from the digital devices by the porous silicon regions previously formed. In the embodiment of the device wherein the noise-sensitive element is a passive component such as a capacitor, the passive component is formed directly on the porous silicon region. In this embodiment, the surface area of the porous silicon region is at least as large as the surface area of the component. Furthermore, as was the case in the mixed signal device, the degree of isolation obtained is related to the depth of the porous silicon region in the substrate, i.e., for a given area of porous silicon, the degree of isolation increases with the depth of the porous silicon region in the substrate. Also, since the capacitor is formed on the porous silicon region, the porous silicon is formed prior to the formation of the capacitor.

DETAILED DESCRIPTION

Figure 1:
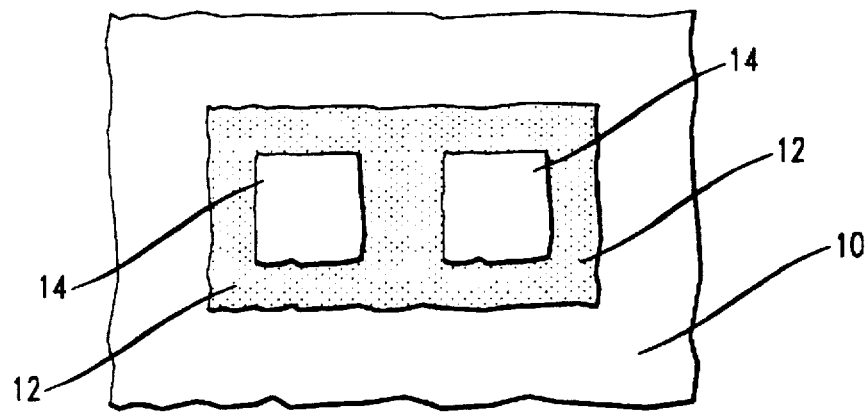
FIG. 1 is a top view of a schematic of a device of the present invention.
Figure 2:
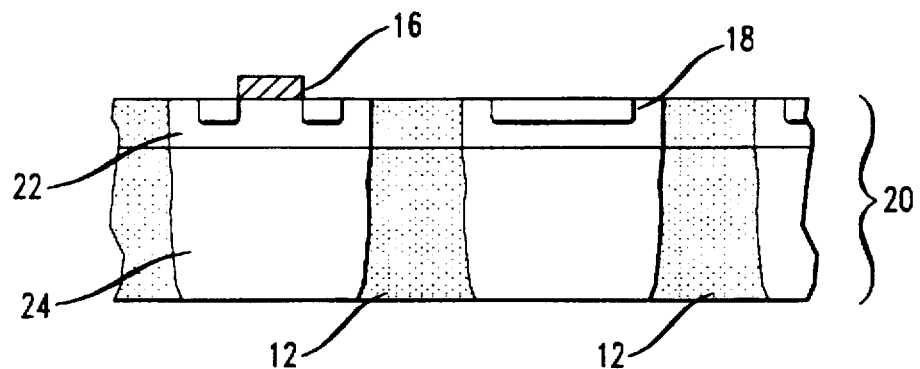
FIG. 2 is a cut away side view of a device of the present invention.

The present invention is directed to a process for fabricating an IC with at least one noise-generating circuit element (e.g. a digital circuit element) and at least one noise-sensitive circuit element (e.g. an analog circuit element or a capacitor). For convenience, the IC with both analog and digital circuit elements is referred to as a mixed-signal IC. In the process, regions of porous silicon are formed in the silicon substrate. The regions of porous silicon isolate the noise-sensitive elements from the noise-generating circuit elements. The regions of porous silicon are formed using conventional techniques well known to one skilled in the art. It is advantageous if the porous silicon is formed using an electrolytic process which anodizes the silicon using an electrolytic solution. Such techniques are described in Unagami, T., et al., "An Isolation Technique Using Oxidized Porous Silicon," *Semiconductor Technologies*, Vol. 8, Chap. 11, pp. 139–154 (OHMSHA and North-Holland Publishing Company 1983) which is hereby incorporated by reference.

In the process of the present invention, the substrate in which the porous silicon region is formed is typically a silicon substrate with a lightly doped layer formed over a more heavily doped layer. In one embodiment of the present invention, a layer of epitaxial silicon is formed over a silicon substrate which is heavily doped with a p+ dopant. The layer of epitaxial silicon is lightly doped with a p− dopant. The regions of porous silicon are formed on the substrate by forming a masking layer on the epitaxial silicon layer through which is exposed those regions of the substrate in which the porous silicon is to be formed. The mask is formed using standard lithographic techniques well known to one skilled in the art. In one embodiment, a soft-baked photoresist (e.g. American Hoechst 1024, having a thickness of about 5000 Å) with a thickness in the range of about 2000 Å to about 2 μm is contemplated as a suitable mask material. In an alternative embodiment, a mask of silicon nitride ($Si_3N_4$) with a thickness in the range of about 400 Å to about 4000 Å is contemplated as a suitable mask material.

The masked substrate is then subjected to conditions that form porous silicon in the region or regions of the wafer exposed through the mask. In the embodiment of the present invention wherein porous silicon is used to isolate a digital circuit element from an analog circuit element, it is advantageous if the thickness of the porous silicon region interposed between the digital and analog circuit elements is at least about 100 μm to adequately isolate the analog element from the noise generated by the digital circuit element.

It is advantageous if the porous silicon region is formed through the thickness of both the p− epi layer and the p+ substrate. The depth to which the porous silicon region penetrates the substrate is readily controlled by controlling the amount of time that the silicon is subjected to the anodization conditions. After the porous silicon region is formed on the wafer, the wafer is not subjected to conditions which would substantially oxidize the porous silicon. Therefore, all steps in the process which require that the substrate be exposed to oxidizing conditions (i.e. the substrate is subjected to elevated temperature in an oxygen-containing atmosphere) are performed prior to the formation of the porous silicon region. For example, to the extent that field oxide regions are formed in the substrate, those regions are formed prior to the formation of the porous silicon regions in the substrate.

If, subsequent to the formation of the porous silicon region, the substrate will be exposed to conditions that would oxidize the porous silicon, it is advantageous if a layer of insulating material such as $SiO_2$ or $Si_3N_4$ is formed on the porous silicon regions. The insulating layer prevents the porous silicon from oxidizing because oxygen does not reach the porous silicon through the insulating layer. It is contemplated that other non-metal or non metal-containing materials will also be useful as an oxygen barrier. Metal and metal-containing layers are not suitable for this purpose because metal diffusion into the silicon substrate or the porous silicon region is not desired. Because the porous silicon is not oxidized, the device is not subjected to the high level of stress that would otherwise result during subsequent processing due to the difference between the coefficient of thermal expansion of the oxidized porous silicon and the coefficient of the thermal expansion of the bulk silicon. Such high levels of stress are potentially damaging to the devices formed on the silicon wafer.

In an alternate embodiment, a noise-sensitive component (e.g., a capacitor) is formed on a region of porous silicon. Examples of suitable capacitors are those that do not have a portion of their structure formed in the silicon substrate such as a metal-oxide-metal (MOM) capacitor. Such capacitors, and methods for their fabrication, are well known to one skilled in the art. Therefore, capacitors, and methods for their formation, are not discussed in detail herein.

A MOM capacitor is formed on a layer of insulating material (e.g. $SiO_2$ or $Si_3N_4$). The thickness of the insulating layer is typically about 1 μm. An insulating layer of such thickness provides adequate dc isolation between the capacitor and the underlying substrate. However, an insulating layer of such thickness does not provide the ac isolation required to prevent the coupling of noise from the substrate into the capacitor component.

Figure 3:
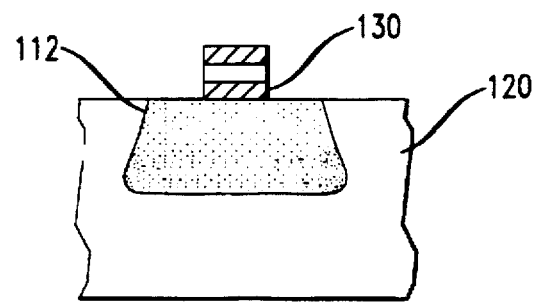
FIG. 3 is a cut away side view of a region of porous silicon with a capacitor formed thereon.

The capacitor is typically a component of an analog circuit. Capacitor components of analog circuits typically have a large area. Since the degree to which a capacitor couples to the substrate is directly proportional to the area of the capacitor, the larger the capacitor, the greater the degree to which it couples to the substrate. Furthermore, the greater the degree to which a capacitor is coupled to the substrate, the greater the amount of noise that capacitor receives from the substrate. Since noise received by the capacitor is transmitted to the analog circuit to which the capacitor is electrically connected, it is advantageous to improve the ac isolation of capacitors from the substrate in addition to isolating the analog circuit elements to which those capacitors are connected. By forming a capacitor on a region of porous silicon, the noise received by the capacitor from the substrate is attenuated, and less noise propagates into the remaining analog circuitry connected to the capacitor. A cross section of such a device is illustrated in FIG. 3, wherein the porous silicon region 112 is formed in silicon wafer 120. A capacitor 130 is formed over the porous silicon 112.

In this embodiment the porous silicon region does not form a barrier to the transmission of noise in a lateral direction through the substrate. Instead, the porous silicon region prevents the noise propagating through the silicon substrate from propagating from the substrate and into the capacitor.

In yet another embodiment of the present invention, substrate noise received by an analog circuit is adequately attenuated by isolating only the MOM capacitor components of the analog circuit. Such isolation is accomplished by forming each such capacitor on a region of porous silicon.

In conventional processes for device fabrication, the backside of the silicon wafer substrate is typically thinned down at some point in the process using a technique referred to as lapping. Since the backside of silicon wafers are typically subjected to lapping, it is not necessary for the porous silicon region to be formed through the entire thickness of the wafer in order to achieve complete isolation. In order to achieve complete isolation, the porous silicon region need only be formed to the depth in the substrate that will remain after the backside of the wafer is lapped.

Also, as previously noted, in some embodiments a certain amount of "cross-talk" (i.e. noise from the noise-generating element reaches the noise-sensitive element) is tolerated. In these embodiments, complete isolation of the noise-generating elements from the noise-sensitive elements is not required, even after the backside of the wafer is lapped. Specifically, cross-talk is proportional to the substrate resistivity. Porous silicon is much more resistive than single crystalline silicon. Consequently, the larger the cross-sectional area of single-crystalline substrate that connects the noise-generating device with the noise sensitive-device, the greater the amount of cross-talk between the two devices. If the porous silicon region is not formed through the substrate thickness, a low resistance single-crystalline path remains through which noise will propagate. However, the amount of noise that will propagate through the path will be less than if there were no porous silicon region at all, because the porous silicon region increases the overall resistance of the substrate. One skilled in the art will appreciate how to control the dimensions of the porous silicon region to obtain the amount of isolation required for a particular application.

Although conditions suitable for the formation of porous silicon are well-known to one skilled in the art, the following are provided as one example of suitable conditions. A silicon wafer with a mask thereon as previously described is placed in an electrochemical cell. The wafer is fastened between a metal plate and a Teflon® enclosure. Teflon® is a registered trademark of E.I. DuPont de Nemours & Co. An aperture in the Teflon® enclosure contains and allows fluid communication between the polished top surface of the wafer and the electrolyte solution of an electrochemical cell. The electrolyte is a 1:1 (by volume) solution of hydrofluoric acid and alcohol. A platinum cathode is placed in the solution. In ambient light a current density of 50 mA/cm$^2$ is applied to the cell. This current density provides an etch rate of about 5 μm/min and a porosity of about 60 percent to the exposed silicon. The silicon wafer is subjected to these conditions for a time sufficient to form a region of porous silicon of the desired depth.

Although the invention herein is described in terms of several embodiments, it is understood that these embodiments are examples of the invention, which is defined by the appended claims.

What is claimed is:

1. An integrated circuit device comprising:
   a silicon substrate, at least one noise-sensitive component selected from the group consisting of a noise-sensitive circuit element and a capacitor formed on the silicon substrate, at least one noise-generating circuit element formed on the silicon substrate, and a porous silicon barrier in the silicon substrate between the noise-generating component and the noise-sensitive circuit element.

2. The device of claim 1 wherein the noise-generating component is a digital circuit element and the noise-sensitive circuit element is an analog circuit element.

3. The device of claim 1 wherein the noise-generating component generates a signal that propagates through the silicon substrate and wherein the porous silicon barrier prevents substantially all of the signal from transmission to the noise-sensitive circuit element.

4. The device of claim 3 wherein the porous silicon barrier is formed through the thickness of the silicon substrate.

5. The device of claim 4 further comprising a layer of silicon dioxide formed over the porous silicon.

6. The device of claim 5 wherein the noise-sensitive component is a capacitor and the capacitor is formed on the porous silicon barrier formed in the substrate, wherein the surface area of the porous silicon region is at least as large as the surface area of the capacitor.

* * * * *